United States Patent
Rosén

[11] Patent Number: 5,986,355
[45] Date of Patent: Nov. 16, 1999

[54] ARRANGEMENT AND METHOD FOR REDUCTION OF MAGNETIC FIELDS AND USE THEREOF

[75] Inventor: Magnus Rosén, Olofstorp, Sweden

[73] Assignee: AB Volvo, Gothenburg, Sweden

[21] Appl. No.: 08/981,517

[22] Filed: Apr. 20, 1998

[30] Foreign Application Priority Data

Jun. 27, 1995 [SE] Sweden ................................. 9502313

[51] Int. Cl.$^6$ ............................................ H01F 27/42
[52] U.S. Cl. .................... 307/101; 307/9.1; 307/10.1; 174/35 R; 336/84 R; 361/159; 361/267
[58] Field of Search .................. 307/10.1, 9.1, 307/101; 361/149, 159, 267; 174/35 R; 123/195 E; 335/284; 336/84 R; 315/8

[56] References Cited

U.S. PATENT DOCUMENTS

| | | | |
|---|---|---|---|
| 4,388,666 | 6/1983 | Kuno et al. | 361/149 |
| 4,761,536 | 8/1988 | Blakely | 219/123 |
| 5,039,911 | 8/1991 | Buhler | 315/8 |
| 5,463,313 | 10/1995 | Berkcan | 324/117 |
| 5,594,615 | 1/1997 | Spijkerman et al. | 307/91 |

FOREIGN PATENT DOCUMENTS

| | | |
|---|---|---|
| 0 569 197 | 11/1993 | European Pat. Off. . |
| 2 283 646 | 5/1995 | United Kingdom . |
| 90/01861 | 2/1990 | WIPO . |
| 94/26084 | 11/1994 | WIPO . |

*Primary Examiner*—Albert W. Paladini
*Attorney, Agent, or Firm*—Burns, Doane, Swecker & Mathis, L.L.P.

[57] ABSTRACT

The present invention relates to an arrangement for reduction of magnetic alternating fields for example in a vehicle or similar which comprises at least one electrical system which comprises at least two elements of which at least one comprises one or more components generating and/or consuming electricity, and which are connected through at least one connecting cable in which flows a current having an alternating current component generating a low frequency magnetic field. The arrangement also comprises at least one detecting element which is arranged to detect the alternating current component, and means for generating a compensating current with the use thereof. The compensating current flows adjacent to the connecting cable in such a way that the low frequency magnetic field is reduced or eliminated.

24 Claims, 7 Drawing Sheets

ARRANGEMENT AND METHOD FOR REDUCTION OF MAGNETIC FIELDS AND USE THEREOF

TECHNICAL FIELD

The present invention relates to an arrangement for reducing magnetic alternating fields in for example a vehicle or similar in which at least one electrical system is arranged. Electrical systems may cause currents flowing for example through cables between different parts of the electrical system etc. These currents may produce low frequent magnetic fields for which recommended limiting values are given and they may have effects for example on the human being have until now not been established. Such fields may in some cases also have a disturbing effect on surrounding equipment.

The invention also relates to a method for reducing magnetic alternating fields in vehicles or similar.

STATE OF THE ART

Lately the influence of electromagnetic fields on human beings and animals has been more and more investigated. The sources of electromagnetic fields have been investigated, arrangements have been developed for measuring electromagnetic fields and different national authorities have recommended limiting values which from a safety point of view have been supposed to be satisfactory.

Furthermore various arrangements and systems have been developed for reducing electromagnetic fields for which sensitive equipment as well as human beings run the risk of being exposed to.

Generally the human being today risks being exposed to more and more fields of various kinds. This is among others discussed in "Managing Magnetic Fields" by John Douglas, EPRI Journal July/August 1993. Such fields are for example present around power lines, cables in the ground, grounding connections and various kinds of appliances. A number of different measures have been proposed in this document as well as in other documents in order to reduce the exposure to electromagnetic fields. Generally they are based on increasing the distance from the disturbing source, for example the power line etc. Another way is based on providing shielding between a disturbing object or a cable and the location in which human beings spend longer or shorter time periods.

In WO 90/01861 an arrangement for reduction of electromagnetic fields within a room is described. Through this arrangement a controlled magnetic field component is created which interferes with a disturbing magnetic field component in order to reduce the field from the latter. For this purpose a number induction windings and a number of controlling magnetic field sensors, which to the number exceeds the number the windings, are used. The windings are so arranged that they encompass the room in three dimensions.

Also WO 94/26084 discloses an arrangement for reducing magnetic fields for example in a transformer station or similar. The arrangement comprises at least one sensor for detecting the magnetic field, a current amplifier and at least one compensating coil arranged for example along the walls of the station. The electric signals which are produced form input signals to the current amplifier which is adapted to provide the compensating coil with a current.

It is however realized that these arrangements can not be used in those cases wherein the space available for compensating arrangements is very limited, where it is of utmost importance to keep the weight as low as possible etc. and furthermore that in such cases it is not possible to use the fact that the field is considerably reduced with the distance. Furthermore so called magnetic self protection arrangements for vessels etc are known through which it is intended to reduce the magnetic fields generated by the vessel itself. The fields are then detected and windings are arranged in and around the vessel possibly in three dimensions. This is for example of interest in situations of war and similar when it is of the utmost importance that the vessel can not be detected through the fields from their metal bodies. However, also in this case the space available is comparatively unlimited and this factor does not need to be taken into consideration when constructing the arrangement.

SUMMARY OF THE INVENTION

Hitherto it has not been paid attention to the fact that magnetic alternating fields, for example low frequent magnetic fields can be present in vehicles and that these magnetic fields often exceed recommended limiting values which for example in some nations (for example Sweden) is 0.2 $\mu$T as well as they might have a disturbing influence on different technical systems and for example might induce disturbances in surrounding signal cables, for example different audiosystems e.g. for radio, CD-players, radiocassettes, navigation systems and similar. For different kinds of vehicles the limiting value has shown to be exceeded between 1 and 65 times. These low frequent magnetic fields among others come from the electricity distribution system that is used in a car. For example it is customary that electricity generating systems or electricity distribution systems are divided in so far that for example a generator can be arranged in the front part of the vehicle at the motor whereas for example the battery can be arranged at the rear part. This has as a consequence that currents flow between the front part and the rear part of the car. The current then flows in a loop and among others depending on how it is formed and its surrounding, both a direct magnetic field is created in the coupé as well as magnetic fields are produced in the iron plates of the car body. Generally is by low frequent magnetic fields understood fields within a frequency range of about 20 Hz–2 kHz. The present invention is however not limited to reducing or eliminating such fields which however constitutes an advantageous embodiment, but also fields in other frequency ranges, for example between about 10 mHz to a few hundreds of kHz.

In order to remedy the abovementioned problem and to reduce the magnetic fields that are created, particular aspects have to be considered and a number of factors have to be included into the calculations which are not relevant for the solutions as presented relating to power lines, vessels etc. These factors are among others that the reducing arrangement may not considerably increase the weight of the vehicle or the electrical system and they may also not require too much space. In the particular case of an electric generator and a battery, the current between those have a direct current component in the order of magnitude of ±100 A on which an alternating current having a root-mean-square value normally of the order of magnitude of about 1–10 A is superposed. It is the latter that produces the low frequent magnetic alternating fields.

Of course such (superposed) alternating current components can be generated in other ways in a vehicle or similar, it does not have to be between a generator and a battery and those do also not have to be arranged in such a way as described above but irrespectively of how and where an alternating current component which is superposed on a direct current component is created, if it for example produces low frequent magnetic alternating fields exceeding the limiting value in vehicles so that technical equipment and/or human beings can be exposed thereto, these problems need to be solved. The problem that the invention intends to solve may generally be present where such a current (having a repetitively or a discontinuously varying component) flows between a current consuming or a current supplying arrangement and something else. The present invention has as an object to provide an arrangement for reducing magnetic alternating fields in vehicles or similar wherein such magnetic fields are generated around one or more cables.

Furthermore it may in an advantageous embodiment be an object of the invention to provide an arrangement for reduction of magnetic alternating fields generated in the body of a vehicle or similar for example through return currents between different parts included in an electrical system, for example an electric distribution system or the electricity generating system of the vehicle.

A particular object of the invention is to provide an arrangement through which magnetic alternating fields (for example low frequent) that are produced around one or more cables as well as in the body of the vehicle or similar can be reduced.

Therefore an arrangement is provided which comprises at least one detecting arrangement for direct or indirect detection of an alternating current component which is superposed on a direct current component and means for generation of a compensating current and current carrying means in connection to the cable comprising the alternating current component so that with the use of the compensating current, the field that is generated through the cable or the cables is reduced or eliminated. Particularly the current carrying means, for example a conductor that is arranged in connection to the cable comprising the alternating current component is connected in that end, (the returning end) that is opposite to that through which the current is supplied, in such a way that it compensates for magnetic fields generated in the body or similar. An alternating current component may contain one or more frequency components. In a particularly advantageous embodiment it is the same current that compensates both for fields generated by current in cables as fields generated through return currents in the body.

Further advantageous embodiments are given through the characterizing features of the subclaims.

It is also an object of the invention to provide a method of reduction of magnetic alternating fields in vehicles or similar; (for example low frequent) magnetic alternating fields that are generated by cables in which a direct current flows on which an alternating current component is superposed and/or alternating fields that are generated in the body or similar. Therefore a method is given through which the alternating current components superposed on a direct current that is generated between first and second arrangements of an electrical system, are reduced through the generation of a current oppositely directed thereto and which has substantially the same amplitude, wherein this compensating current is fed substantially parallelly to the disturbing current through the disturbing cable. More particularly the compensating current is supplied in a compensating cable which is so connected that also fields generated through return conduction in the body or similar are reduced or eliminated.

The invention also relates to a vehicle with an arrangement for reducing magnetic alternating fields.

DESCRIPTION OF THE DRAWINGS

The invention will in the following be further described in a non-limiting way under reference to the accompanying drawings in which.

DETAILED DESCRIPTION OF THE INVENTION

The invention will in the following be described in a more detailed manner under reference to the disturbing magnetic alternating fields that are generated in a motor car, particularly a private car. The invention is however not limited to vehicles or cars but it can also be applied elsewhere where similar problems arise and where the space available for providing for the compensation is limited and where it furthermore may be of importance that the arrangement for reduction of the disturbing fields does not involve any particular increase in weight.

The following description relates to private cars in which the electricity generating system can be said to the physically split up in such a way that the generator is located in the front part at the motor whereas the battery is located in the rear part, which comprise first and second arrangements forming part of an electric system. Generally, one of the arrangements may be an electricity consumer or an electricity supplier. Since the arrangements are so arranged, currents will flow between the front and the rear part of the car. The current then follows a loop which due to its forming and its surroundings on one hand generates a direct magnetic field in the coupé and on the other hand generates a current in the iron plate of the body which vagabonds and generates fields to the surroundings. The current between the electric generator and the battery has a direct current component having an intensity of about ±100 A on which is superposed an alternating current component, the root-means-square value of which reaches about 1–10 A. Through this superposed alternating current component the disturbing magnetic alternating fields are generated. The connecting cable between the electric generator and the battery generates a disturbing field whereas another disturbing field is generated in the body through the galvanic return current.

Figure 1:
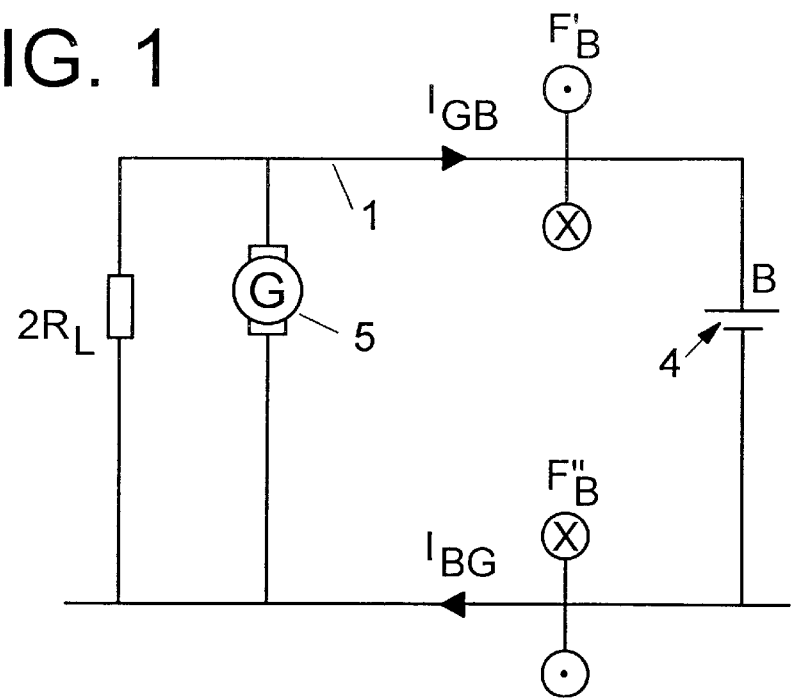
FIG. 1 shows an example on a circuit generating magnetic fields (without compensation), FIG. 2 schematically illustrates an arrangement compensating for disturbing fields according to a first embodiment, FIG. 3 schematically illustrates a car having a reducing arrangement according to the invention.

In FIG. 1 is illustrated an existing circuit in the vehicle which produces disturbing fields in the absence of an arrangement for reduction thereof. The circuit comprises a generator 5, a load 2 $R_L$, (this is of no importance for the invention since it is a passive load). Generally (not shown) the load could for example be an active consumer (or supplier) so that the field generated around the cable/the cables 1 becomes a combination of two fields which require compensation. Furthermore a battery 4 is included and the body 2 acting as a return conductor 2. The generator 5 may for example be a 3-phase-rectified alternating current generator as is often used in vehicles and it generates an unwanted alternating current component depending on the curve shape in internal phase voltage. It can also be some other kind of current consumer (for example an ignition system) or a current supplying component that consumes/ supplies a current having a perioically varying amplitude. The alternating current $I_B$ (the ripple current $I_{GB}$ between the generator and the battery and the ripple current $I_{BG}$ between the battery and the generator in the body) generates the magnetic fields $F_B'$ and $F_B''$. According to the invention the magnetic field $F_B'$ is neutralized through an oppositely directed field generated in a cable arranged parallelly with the connecting cable and the alternating magnetic field $F_B'$ is neutralized through a current oppositely directed to $I_{BG}$. If there does not flow a current $I_{BG}$, there is also no field $F_B''$. According to an advantageous embodiment the field oppositely directed to $F_B'$ is generated by the same current that neutralizes the other magnetic field $F_B''$ that is generated in the body. The amplitude of the oppositely directed field should be the same but of the opposite sign, i.e. the phase difference should be 180°. This means that the current in the parallel compensating cable may have the same amplitude as the disturbing current.

Figure 2:
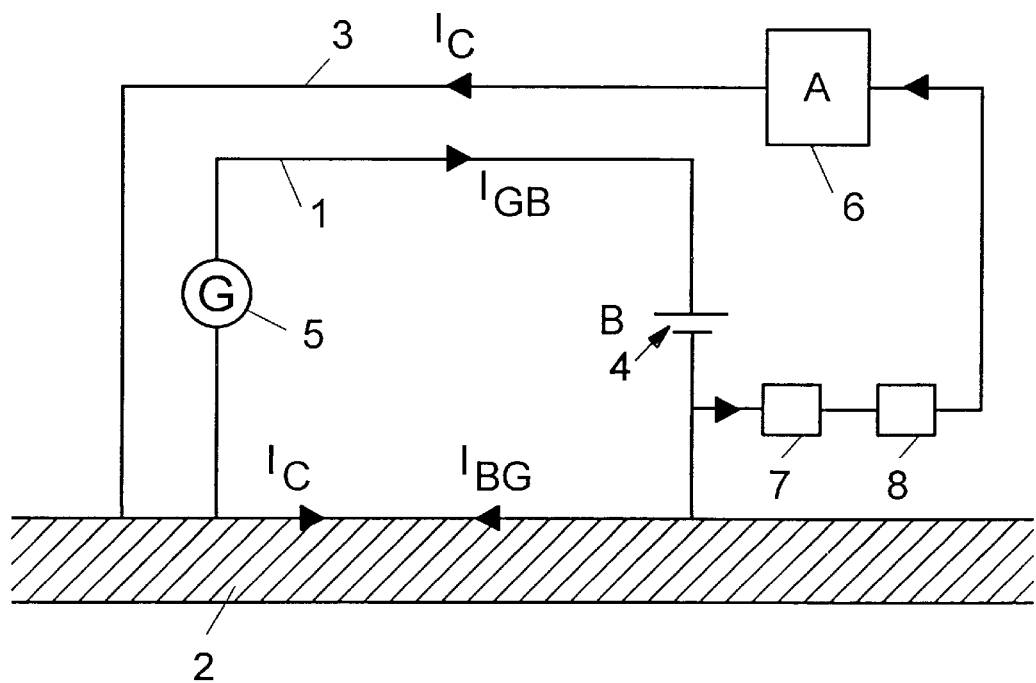

In FIG. 2 is schematically illustrated an example of an arrangement for reducing the disturbing fields. Between the generator 5 and the battery 4 flows in the connecting cable of the disturbing cable 1 the current $I_{GB}$ and in the body 2 the return current $I_{BG}$ flows. A current detecting arrangement 7 is arranged for detecting the current between the battery 4 and the generator 5, i.e. the return current $I_{BG}$. The current $I_{GB}$ comprises a ripple current between the generator 5 and the battery 4 and it is this current that causes the magnetic alternating field around the cable 1. The current $I_{BG}$ denotes a ripple current between the battery 4 and the generator 5 and this is current causes the magnetic field in the body.

A detecting arrangement 7 is arranged for detecting the current $I_{BG}$. Thereafter a filter arrangement 8 (for example a high pass filter) is arranged for separation of an alternating current component. If the output signal from the detecting arrangement 7 does not correspond to the total detected current, a current amplifier 6 (A) is arranged after the filtering arrangement 8. The output signal from the filtering arrangement or the current amplifier 6 comprises the compensating current $I_C$ which flows through the compensating cable 3. The compensating current $I_C$ causes a magnetic field that eliminates the magnetic field generated in the disturbing cable 1. The compensating cable 3 is connected in a convenient way to the body and through this flows similarly the compensating current $I_C$ which eliminates the current $I_{BG}$ and thus also the disturbing magnetic alternating field generated thereby.

The conductor 3 for the compensating current $I_C$ is considerably smaller than the disturbing cable 1 due to the particular reason that only compensation for the superposed alternating current is required. Thus is achieved that the arrangement for reducing disturbing fields does not have to any considerable extent influence neither the weight nor the built-in volume.

The detecting arrangement 7 can of course also be arranged between the battery 4 and the generator 5 so that instead the current $I_{GB}$ is detected. Also in other ways the arrangement can be formed in a number of different ways of which some will be discussed in the following.

Figure 3:
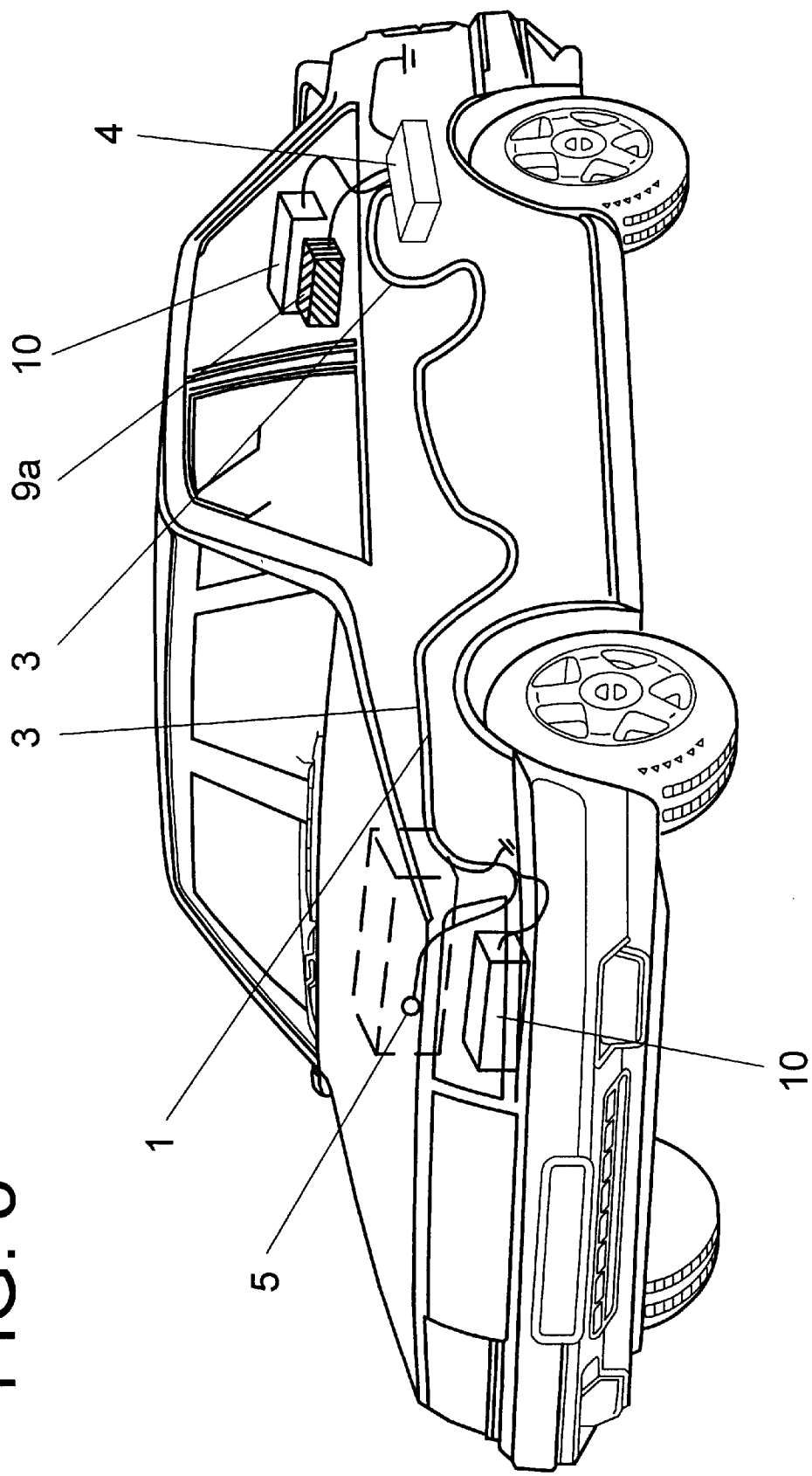

FIG. 3 schematically illustrates a private car wherein a current (corresponding to $I_{GB}$) flows between a generator 5 and a battery 4 in the cable 1. A compensating cable 3 is arranged substantially as discussed above. The reference sign 10 indicates electric centrals. The compensating current is generated in the unit 9a which among others comprises detecting and amplifying arrangements.

Figure 4:
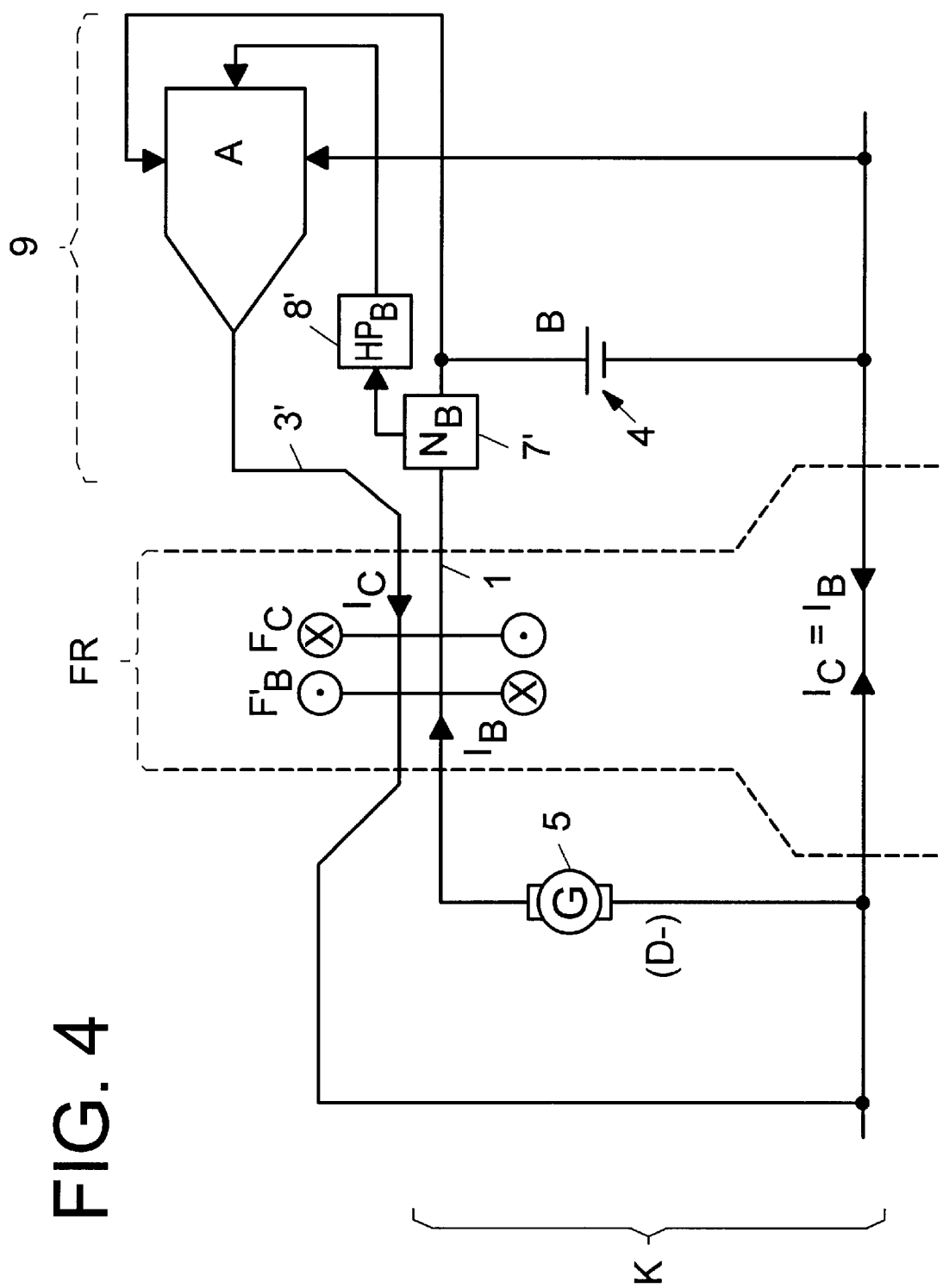
FIG. 4 illustrates an arrangement of reducing a disturbing field according to the invention.

FIG. 4 illustrates an example of an arrangement according to the invention which is fed forwardly. In the figure the bracket K illustrates the original circuit, i.e. the one that causes the disturbing fields. The bracket denoted FR denotes the area within which a field reduction is obtained. Like in FIG. 1 $F_B'$ illustrates a disturbing magnetic alternating field which is generated by the current $I_B$ through the connecting cable 1 between the generator 5 and the battery 4. This current is detected in the detecting arrangement 7' ($N_B$) which comprises means for current detection and the output signal from which is a fraction of the cable current $I_B$; for example the output signal may be $\frac{1}{1000}$ of the current $I_B$ in the disturbing cable 1. This fraction is then filtered in a filtering arrangement 8' ($HP_B$) which comprises a high pass filter and in which the alternating current component is filtered out from the detected fraction of the disturbing current $I_B$. In the amplifying arrangement A the fraction filtered out from the disturbing current $I_B$ is amplified for example a thousand times. Thereafter the amplified current (the compensating current $I_C$) is fed out on to the compensating cable 3' parallelly with the disturbing cable 1. Bracket 9 generally denotes apparatuses for field reduction. The compensating cable 3' is arranged beside the disturbing cable 1. According to an advantageous embodiment the compensating cable is connected to the disturbing cable 1 but according to an alternative embodiment there is a slight play between the compensating cable 3' and the disturbing cable 1. Different designs of the compensating cable will be illustrated in FIG. 8 and, for example, instead of one compensating cable, two compensating cables can be used etc. According to one embodiment the area in cross-section of the disturbing cable 1 reaches about 50 mm² and the compensating cable for example has an area with a cross-section of 1 mm². With the use of the compensating cable the compensating field $F_C$ is generated through which the disturbing field $F_B$ is reduced or eliminated. The compensating cable 3' is connected with its other end (the return end) in the vicinity of the return conductor (D⁻) of the generator. According to an advantageous embodiment (which can be implemented in the different embodiments) the amplifying arrangement is an active transistor amplifier and the battery provides for the voltage feeding.

In the example illustrated in FIG. 4 the detection is done with the use of a detecting arrangement 7' arranged on the positive side of the battery. Alternatively the detecting arrangement may be arranged to detect the current on the negative side of the battery. According to an advantageous embodiment the amplifying arrangement A is arranged close to the battery 4. The compensating current $I_C$ can be taken from the battery which delivers current substantially without being affected.

Since the return end of the compensating cable 3' for example is connected galvanically to the body, also the field generated in the body will be reduced or eliminated. The arrangement shown in FIG. 4 is as can be seen forwardly connected.

Figure 5:
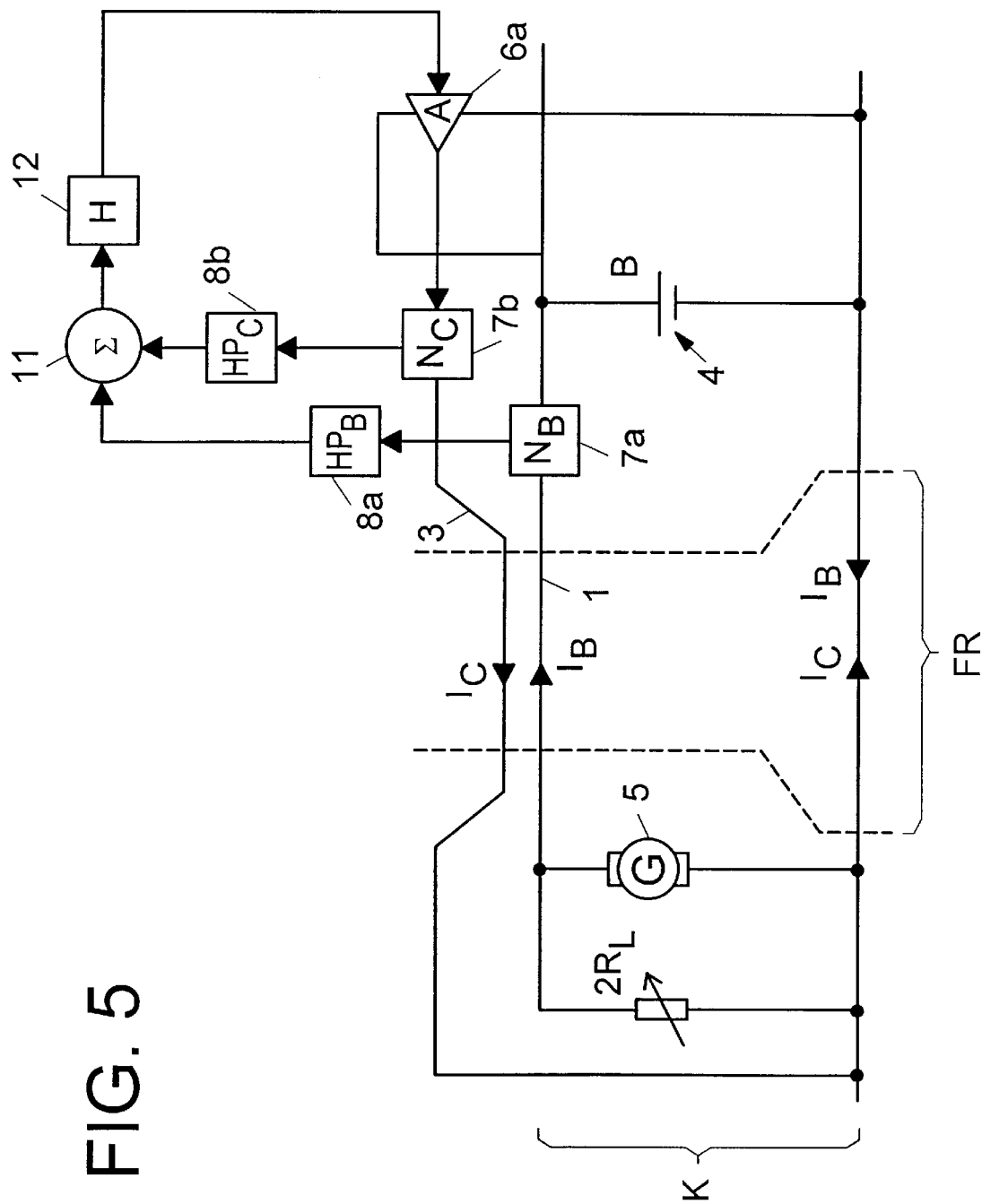
FIG. 5 illustrates an alternative embodiment of an arrangement using feedback for reducing disturbing fields.

In FIG. 5 an alternative embodiment of the invention is shown in which the arrangement for field reduction uses feedback connection.

Also in this case the bracket K denotes the original circuit whereas the bracket FR illustrates the area having a field reduction, the section comprising an oppositely directed field. This embodiment is somewhat more complicated but it has the advantages that the tolerance and the operating tolerance respectively can be further increased. In the embodiment illustrated in FIG. 5 a first detecting arrangement 7a ($N_B$) is arranged on the positive side of the battery 4 to detect the disturbing current $I_B$ in the current cable. In the filtering arrangement 8a ($HP_B$) is in a way similar to that of the preceding embodiment, the alternating current component filtered out. A second detecting arrangement 7b ($N_C$) is arranged to detect the compensating current $I_C$ output from the amplifier 6a (A). Thereafter a second filtering arrangement 8b ($HP_C$) is arranged to filter out the alternating current component from the compensating current generated in the amplifier 6a. The two alternating current components from the first and the second filtering arrangements 8a, 8b respectively are compared in a comparing arrangement (comparator) 11 and if the difference between them exceeds a given value, for example zero or some other appropriate value, the signal is amplified in the amplifying block 12 (H) and the output signal therefrom is input to the output power block 6a (A) and the output signal therefrom, the compensating current $I_C$, will have substantially the same magnitude as the disturbing current $I_B$ and a reduction/compensating is achieved in the same way as in the previously described embodiments both as far as disturbing field around the disturbing cable as well as disturbing fields in the body, which will not be further described herein since this already has been taken account of, are concerned. In this embodiment a current consuming arrangement is symbolized through a varying resistor $2R_L$. This is just one example intended to illustrate that the field around the disturbing cable 1 can be generated both through a current consuming arrangement $2R_L$ and a current supplying arrangement 5 (the generator in this case); this is of course not necessarily the case.

Figure 6:
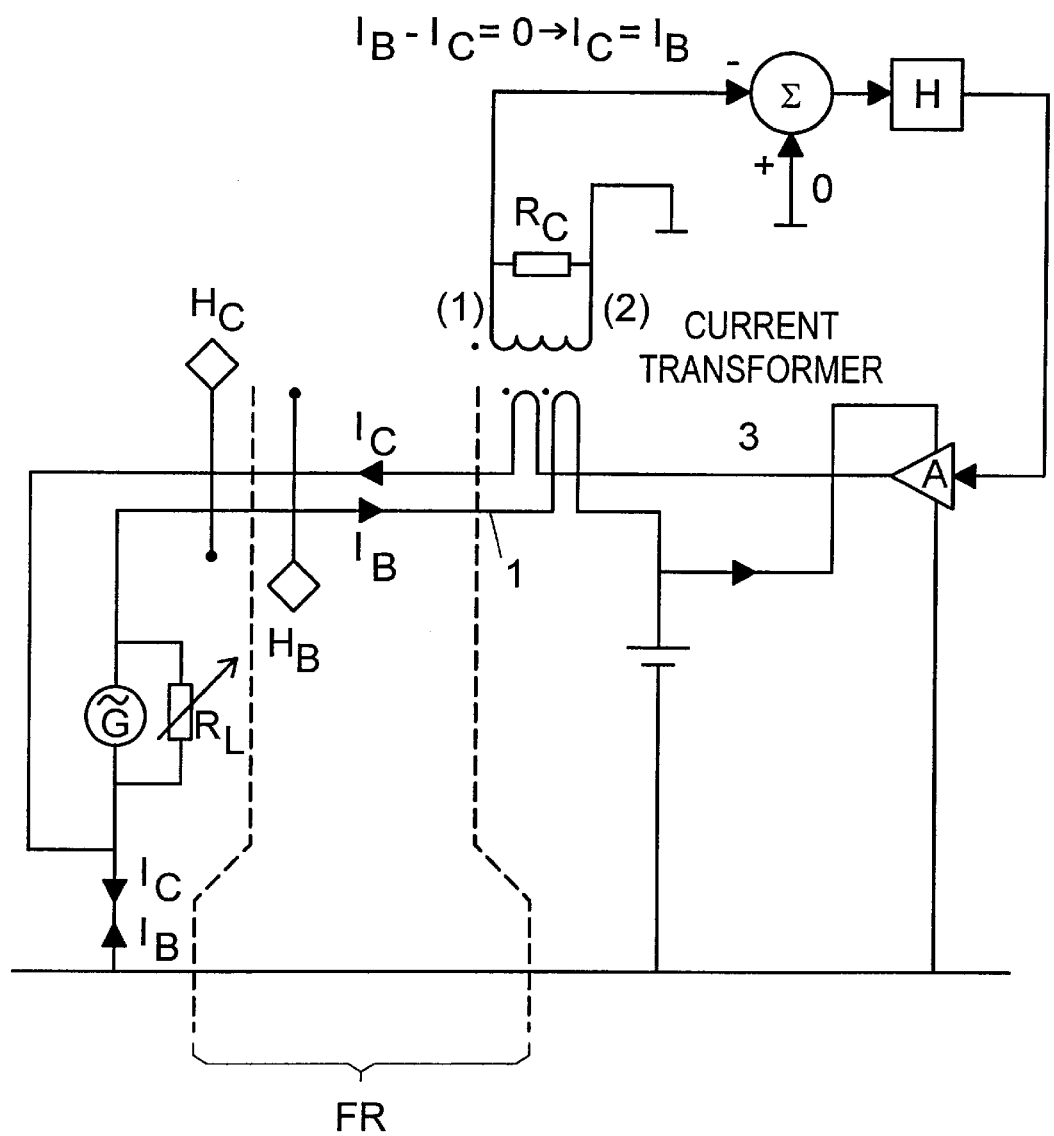
FIG. 6 illustrates an alternative arrangement for reduction of disturbing fields also with feedback, FIG. 7 schematically illustrates still another alternative embodiment of a feedback arrangement, FIGS. 8a–8h schematically illustrate how one or more compensating cables can be arranged in relation to a disturbing cable.

In FIG. 6 a further arrangement is illustrated which uses feed back.

In this embodiment the detecting arrangement comprises a current transformer which on its output (indicated through the brackets (1) and (2) in FIG. 6) gives a current which is proportional to the difference in current intensity between the disturbing current $I_B$ and the compensating current $I_C$. The current for the current transformer is converted to a voltage (the resistance $R_C$ must be higher than zero) and compared in the comparator. If the difference between the currents $I_B$ and $I_C$ differ from a given value, for example zero, the difference is amplified in the amplifying block H and the output current signal is input to the output power block A. The current forming output signal will be similar to the current in the disturbing cable $I_B$ and the output current from the current transformer approaches zero. Since the current $I_B$ in the disturbing cable is the same as the compensating current $I_C$ and is directed as indicated in the figure, the compensating magnetic field $H_C$ will compensate for the disturbing field $H_B$ in a similar way so that the total magnetic field is reduced or eliminated. Also in this case a current consuming arrangement in form of a varying resistor $R_L$ is illustrated. This is of course not necessarily the case.

Figure 7:
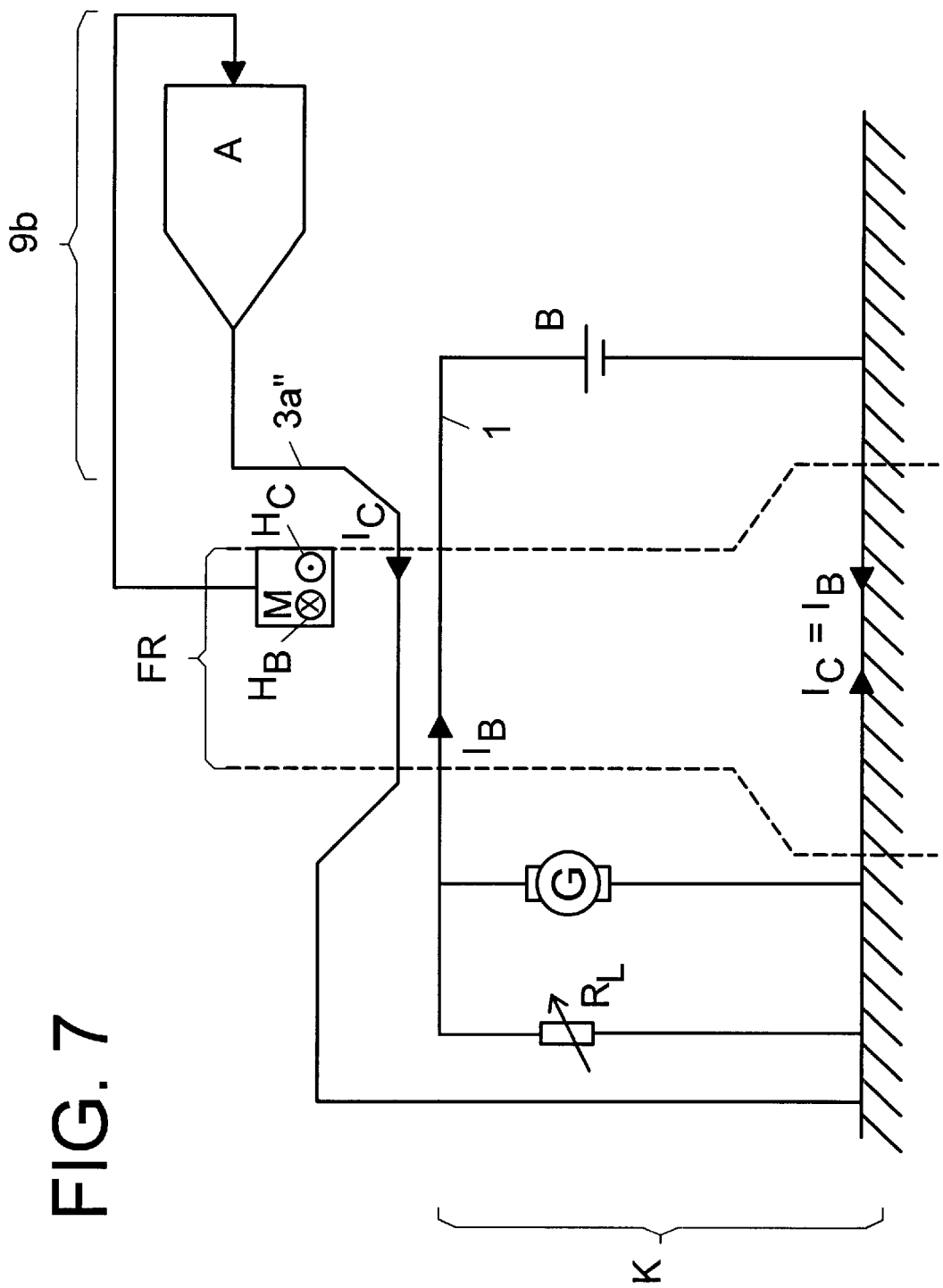

In FIG. 7 a further embodiment of the invention is illustrated which is based on a feedback system. Like in the previous figures, K illustrates the original disturbing field generating circuit whereas FR denotes the area within which the field is reduced and the arrangement for field reduction is denoted 9b. This system can substantially be said to correspond to what has been described under reference to FIG. 6, but the current transformer has been replaced by a magnetic field sensor. The arrangement for field reduction 9b here operates with a magnetic field sensor which forms part of a closed loop to regulate the magnetic field at the sensor to the value zero (or at least to an acceptably low value). Substantially any magnetically sensitive component which has en electrical quantity as an output signal, can be used as a magnetic field sensor. Advantageous embodiments are given for example through a wire-wound solenoid, a Hall-effect probe, a flux-gate probe or a magneto-resistive sensor.

The arrangement 9b of FIG. 7 detects the different between the magnetic field resulting from the disturbing cable in which the current $I_B$ flows and the compensating cable through which the compensating current $I_C$ flows. The difference between the currents is amplified and controls the current in the compensating cable 3a". An advantage of this feedback system is that it shows a high tolerance to variation in the parameters of the components. Furthermore the arrangement works in a way corresponding to those described under reference to the preceding embodiments. This means that the field generated through the disturbing cable as well as the field in the body is reduced or eliminated.

In FIGS. 8a–8h a number of different alternatives of the arrangement of at least one compensating cable, here denoted KK, in relation to a disturbing cable which here is denoted SK, are shown which are applicable to among others the above described embodiments. The disturbing cable may also comprise a cable trunk in which two or more disturbing cables have been bundled together. The compensating cable or the cables are to be arranged in close relationship to the disturbing cable or the cable trunk all over the area within which reduction of disturbing magnetic fields is desired. In order to achieve reduction also for fields generated through return currents for example in the car body, the return end or the return ends are connected to the compensating cable(s) in close vicinity of, or next to, the returning point of the disturbing source which has been described earlier in the application and illustrated through the other figures.

Figure 8A:
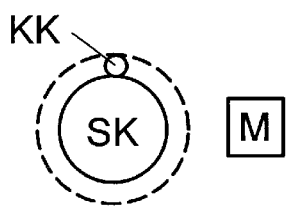

In FIGS. 8a–8h the cross-sectional geometries of the disturbing cable or cable trunk and the compensating cable or the compensating cables are illustrated. In the schematical illustrations it is supposed that a magnetic field sensor M is used even if of course other alternatives are possible as described in the foregoing. In FIG. 8a a compensating cable KK is arranged close to the disturbing cable SK. The relationships between the diameters that are illustrated in the FIGS. 8a–8h are merely intended to indicate that the diameter of the compensating cable(s) is much smaller than that of the disturbing cable (or trunk).

Figure 8B:
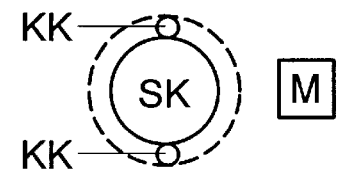
Figure 8C:
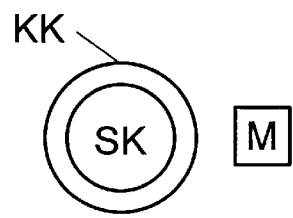

In FIG. 8b two compensating cables KK are arranged on either side of the disturbing cable SK. In FIG. 8c an alternative embodiment is illustrated wherein the compensating cable is designed as a screening cover surrounding the disturbing cable.

Figure 8D:
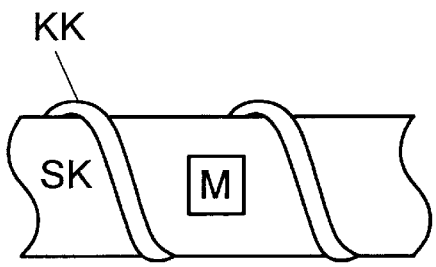
Figure 8E:
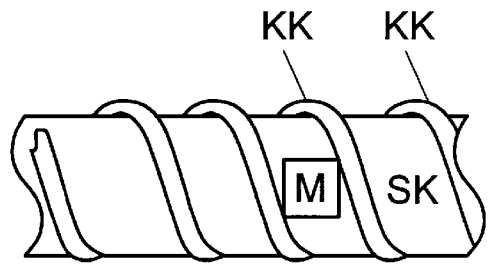
Figure 8F:
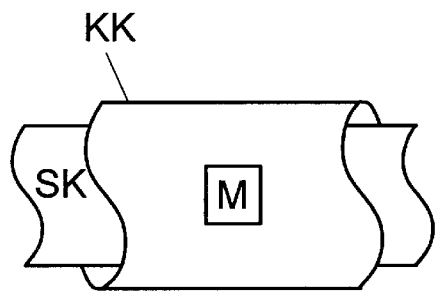

In FIG. 8d the compensating cable KK is wound around the disturbing cable SK whereas in FIG. 8e two compensating cables are wound around the disturbing cable SK. In FIG. 8f is in a way similar to that in FIG. 8c a compensating cable arranged as a screening cover around the disturbing cable or the cable trunk (but wherein the magnet field sensor is arranged in another way, like in FIGS. 8d and 8e).

Figure 8G:
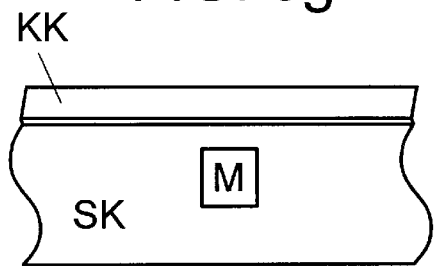
Figure 8H:
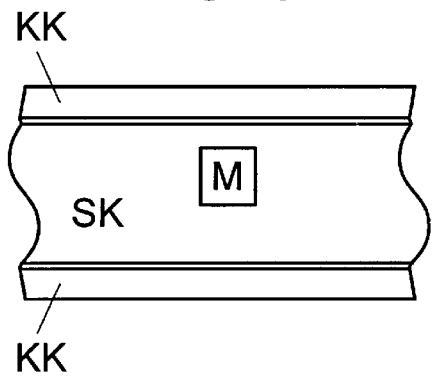

In FIGS. 8g and 8h one and two compensating cables respectively are illustrated which are arranged adjacent and parallelly with the disturbing cable in the same way as in FIGS. 8a and 8b but wherein the magnet field sensor is differently arranged. Particularly those embodiments that are shown in FIGS. 8d and 8e respectively give a very evenly distributed field, in particularly close to the cable combination.

Of course also other alternatives are possible.

Also in other aspects the invention is not limited to what has been shown in the described embodiments but different designs of detecting arrangements can be used, these can be arranged in different ways, c.f. for example on the positive and on the negative side respectively of the battery; also different types of filtering arrangements can be used as well as different amplifiers and similar.

Furthermore the arrangement as referred to above is of course not limited to a vehicle wherein a battery and a generator are arranged as described; they can also be arranged in different ways but on a certain distance from each other; furthermore it does not have to relate to a battery and a generator but also other arrangements (two or more) arranged at a certain distance from each other or arranged in such a way that a disturbing field is generated by a connecting cable. One of the arrangements may be a current consuming arrangement or a current supplying arrangement or comprise more than one of each kind of the arrangements or several different kinds. Furthermore a first or a second arrangement may be passive, for example a cable, i.e. there is just one (first or second) arrangement etc. The invention is applicable everywhere wherein the requirements and the conditions are similar to those that are relevant for a vehicle for example as far as space, weight etc. is concerned. Furthermore, except for different kinds of what is usually meant by vehicles such as private cars, busses, heavy vehicles, trucks, tractors etc. it can for example also be airplanes, which thus here also are included in the concept vehicles etc. independently of the voltage in the direct current system.

I claim:

1. Arrangement for reducing magnetic alternating fields in a vehicle including one or more electrical systems, the arrangement comprising:
   a first element and a second element of which at least one comprises one or more components generating and/or consuming electricity;
   a connecting cable through which current is to flow, the connecting cable being connected to the first and second elements, and the current comprises a superposed alternating current component generating a magnetic alternating field;
   a detecting element arranged to detect at least the alternating current component of the current;
   means for a generating a compensating current;
   a compensating cable for carrying the compensating current, the compensating cable is connected to the connecting cable, the magnetic field generated by the current in the connecting cable being reduced or eliminated by the compensating current in the compensating cable;
   wherein the compensating current only compensates for the superposed alternating current component in the connecting cable;
   wherein the compensating current flows through the compensating cable in a direction which is substantially opposite of the current through the connecting cable; and
   wherein the compensating cable is arranged substantially parallel with the connecting cable and close thereto at least within the area for which a field reduction is to be provided.

2. Arrangement according to claim 1, wherein at least one of the first and second elements comprises a current supplying arrangement with a varying current generation.

3. Arrangement according to claim 1, wherein at least one of said first and second elements comprises a current consuming element having a varying current consumption.

4. Arrangement according to claim 1, further comprising:
   a filtering element for filtering out of the superposed alternating current component, wherein the filtering element is between the detecting element and the means for generating a compensating current.

5. Arrangement according to claim 1, wherein the connecting cable comprises two or more disturbing cables bounded together to a cable trunk, wherein with use of the detecting element the total disturbing alternating current component is detected.

6. Arrangement according to claim 1, wherein the compensating cable comprises one or more compensating conductors arranged in parallel with and substantially adjacent to the connecting cable.

7. Arrangement according to claim 1, wherein the compensating cable is formed as a shielding cover surrounding the connecting cable.

8. Arrangement according to claim 1, wherein the compensating cable comprises one or more compensating cables wound around the connecting cable.

9. Arrangement according to claim 1, wherein the compensating cable has a cross-sectional area which is substantially less than that of the connecting cable.

10. Arrangement according to claim 1, wherein the detecting arrangement is arranged to detect the current that is returned to whichever one of the first or second elements consumes current.

11. Arrangement according to claim 1, wherein an output signal from the detecting element is a fraction of the detected current and wherein a filtering arrangement is arranged to filter out the superposed alternating current component, and wherein the filtered signal is amplified in an amplifying arrangement before output on the compensating cable.

12. Arrangement according to claim 1, wherein the compensating current is used to reduce or eliminate the low frequency magnetic fields around both the connecting cable and around a return conductor.

13. Arrangement according to claim 1, wherein the magnetic field generated through the compensating cable has substantially the same amplitude as the magnetic field around the connecting cable and its phase is displaced substantially 180° in relation thereto.

14. Arrangement according to claim 1, wherein said first and second elements comprise a battery and a generator respectively.

15. Arrangement according to claim 14, wherein the detecting element is arranged to detect the current in the connecting cable or the current through a battery.

16. Arrangement according to claim 14, wherein a return end of the compensating cable is electrically connected to a metal body of the vehicle, wherein the return end of the compensating cable is connected to a point in the vicinity of a return conductor of whichever of the first and second elements generates electricity, for compensation of the magnetic field generated in the body.

17. Arrangement according to claim 1, wherein an intensity of the compensating current is controlled with the use of a feedback circuit.

18. Arrangement according to claim 17, wherein the feedback circuit comprises:
   comparing means to establish the difference between the alternating current component in the connecting cable and the compensating cable; and means for adjusting the compensating current if the difference exceeds a given value.

19. Arrangement according to claim 18, wherein the comparing means comprises a current transformer the output current of which is proportional to the difference between the compensating current and the disturbing current.

20. Method for reducing magnetic alternating fields in a vehicle generated by an alternating current component superposed a direct current, the method comprising the steps of:

detecting a disturbing current flowing between first and second elements of an electrical system, generating an oppositely directed compensating current having substantially the same amplitude as the disturbing superposed alternating current component to compensate for said alternating current component, supplying the compensating current in a compensating cable which is substantially parallel with the disturbing current and in close vicinity thereof, connecting said compensating cable for the compensating current in the vicinity of a return conductor of one of the first or second elements so that the field generated by a connecting cable which is connected between the first and the second elements, and a field generated in a conducting arrangement including a body part of the vehicle which acts as a return conductor for one of the first or second elements, are reduced or eliminated.

21. A vehicle comprising:

an electrical system comprising first and second elements of which at least one generates and/or consumes electricity;

a connecting cable which connects said first and second elements, wherein a current flows through said connecting cable, and the current generates a magnetic alternating field;

wherein the vehicle includes a vehicle body in which is arranged means for reducing or eliminating the magnetic alternating field, wherein said means for reducing or eliminating the magnetic alternating field comprises:

detecting means for detecting alternating current components of the current, means for generating a compensating current and a compensating cable for the compensating current which is arranged so that the compensating current compensates for the generated alternating current component generated by the current in the connecting cables so that the generated magnetic field is reduced or eliminated.

22. A vehicle according to claim 21, wherein an output signal from the detecting means is a fraction of the detected current and wherein a filtering arrangement is arranged to filter out the alternating current component and wherein the filtered signal is amplified in an amplifying arrangement before output on the compensating cable.

23. A vehicle according to claim 21, wherein a return end of the compensating cable is electrically connected to the vehicle body, wherein the vehicle body is metal, and the return end of the compensating cable is connected to a point in the vicinity of a return conductor of whichever of the first and second elements generates electricity, for compensation of the magnetic field generated in the vehicle body.

24. A vehicle according to claim 21, wherein the compensating current is used to reduce or eliminate the low frequency magnetic fields around both the connecting cable and around a return conductor.

* * * * *